United States Patent
Qian et al.

(10) Patent No.: US 9,622,339 B2
(45) Date of Patent: Apr. 11, 2017

(54) ROUTING DESIGN FOR HIGH SPEED INPUT/OUTPUT LINKS

(75) Inventors: Zhiguo Qian, Chandler, AZ (US); Kemal Aygun, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 644 days.

(21) Appl. No.: 13/610,663

(22) Filed: Sep. 11, 2012

(65) Prior Publication Data

US 2014/0071646 A1   Mar. 13, 2014

(51) Int. Cl.
    H05K 1/02   (2006.01)
    H05K 3/46   (2006.01)
    H05K 1/11   (2006.01)

(52) U.S. Cl.
    CPC ......... *H05K 1/0228* (2013.01); *H05K 1/0219* (2013.01); *H05K 3/4644* (2013.01); *H05K 1/0243* (2013.01); *H05K 1/113* (2013.01); *H05K 2201/09336* (2013.01); *H05K 2201/09672* (2013.01); *H05K 2201/09709* (2013.01); *H05K 2201/09727* (2013.01); *Y10T 29/49155* (2015.01)

(58) Field of Classification Search
    CPC .. H05K 1/0219; H05K 1/0228; H05K 3/4644; H05K 1/0243; H05K 1/113; H05K 2201/09336; H05K 2201/09672; H05K 2201/09709; H05K 2201/09727; Y10T 29/49155
    See application file for complete search history.

(56) References Cited

U.S. PATENT DOCUMENTS

| | | | |
|---|---|---|---|
| 5,838,519 A | 11/1998 | Takizawa et al. | |
| 6,040,524 A * | 3/2000 | Kobayashi | H05K 1/0219 174/262 |
| 7,441,222 B2 | 10/2008 | Mathews | |
| 8,188,594 B2 | 5/2012 | Ganesan et al. | 257/713 |
| 8,872,349 B2 | 10/2014 | Chiu et al. | 257/774 |
| 8,946,900 B2 | 2/2015 | Qian et al. | 257/762 |
| 2005/0167811 A1* | 8/2005 | Frech et al. | 257/686 |
| 2010/0096743 A1* | 4/2010 | Ganesan et al. | 257/692 |
| 2011/0074047 A1* | 3/2011 | Pendse | 257/782 |
| 2013/0220690 A1* | 8/2013 | Chang | H05K 1/025 174/262 |

(Continued)

*Primary Examiner* — Steven T Sawyer
*Assistant Examiner* — Ahmad D Barnes
(74) *Attorney, Agent, or Firm* — Konrad Raynes Davda & Victor LLP; Alan S. Raynes (57) ABSTRACT

Certain embodiments relate to routing structures and their formation. In one embodiment a routing structure includes a first region including a first layer comprising alternating signal traces and ground traces separated by a dielectric. The first region also includes a second layer including alternating signal traces and ground traces separated by a dielectric, wherein the second layer signal positioned over the first layer ground traces, and the second layer ground traces positioned over the first layer signal traces. The first region may also include additional layers of alternating signal and ground traces. The first region may also be formed with the ground traces having a width that is larger than that of the signal traces. The routing structure may also include a second region including pads to which the traces are coupled. Other embodiments are described and claimed.

21 Claims, 5 Drawing Sheets

(56) References Cited

U.S. PATENT DOCUMENTS

| | | |
|---|---|---|
| 2014/0160707 A1 | 6/2014 | Zhang et al. ............ 361/767 |
| 2014/0203417 A1 | 7/2014 | Altunyurt et al. ........ 257/664 |
| 2014/0217579 A1 | 8/2014 | Ganesan et al. ......... 257/737 |

* cited by examiner

ROUTING DESIGN FOR HIGH SPEED INPUT/OUTPUT LINKS

BACKGROUND

Trace routing for forming multi-chip package (MCP) high speed input/output (HSIO) interconnect structures is typically formed using microstrip and/or stripline trace routing. Microstrip routing may utilize a layer of signal traces separated from a ground plane by a dielectric layer. Stripline routing may utilize a layer of signal traces sandwiched between two ground planes and separated from the ground planes by dielectric layers.

BRIEF DESCRIPTION OF THE DRAWINGS

Embodiments are described by way of example, with reference to the accompanying drawings, which are not drawn to scale.

DETAILED DESCRIPTION

Reference below will be made to the drawings wherein like structures may be provided with like reference designations. In order to show the structures of various embodiments most clearly, the drawings included herein include diagrammatic representations of electronic devices. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Certain embodiments relate to substrate routing structure regions. MCP HSIO interconnects such as those between die structures and a substrate may be designed to be short but highly dense to maximize the routing density and minimize the die and package area requirements. A tight routing pitch, however, significantly increases the crosstalk between adjacent signal traces and consequently limits the per-lane signaling rate and overall achievable HSIO bandwith. Microstrip routing often displays relatively high crosstalk, which limits the maximum signaling rate. Stripline routing can reduce the crosstalk compared to microstrip routing, but requires one more layer for referencing purposes, which increases the thickness of the package and increases the manufacturing cost.

Certain embodiments relate to substrate routing structures in which reduced crosstalk is achieved while utilize a minimum number of layers, without any increase in the surface area of the substrate or die. Certain embodiments include alternating signal traces and ground traces within the same horizontal layer. Embodiments may also include alternating signal and ground traces in the vertical direction. Embodiments may include structures and methods.

Figure 1:
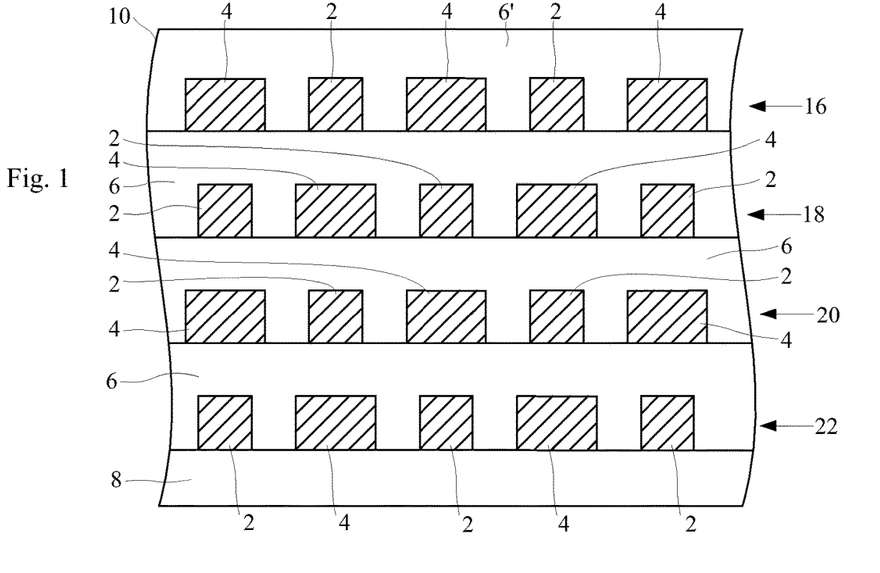
FIG. 1 illustrates a cross-sectional view of a routing layout including traces in a multilayer substrate, in accordance with certain embodiments.

FIG. 1 is a cross-sectional view of a routing structure region in a multilayer substrate 10, in accordance with certain embodiments. The structure includes multiple layers of signal traces 2 and ground traces 4. The ground traces 4 and signal traces 2 are adapted to be electrically coupled to a component such as a semiconductor die structure for transmitting signals to and from the component. FIG. 1 illustrates four routing layers 16, 18, 20, and 22 extending in a horizontal direction, each including alternating signal traces 2 and ground traces 4. The traces 2, 4 are formed from an electrically conductive material, for example, a metal comprising copper. A dielectric material 6, 6' is positioned between the various signal traces 2 and ground traces 4. As illustrated in the view of FIG. 1, adjacent routing layers are configured so that there are alternating signal traces 2 and ground traces 4 both horizontally and vertically. For example, the uppermost routing layer 16 includes alternating ground traces 4 and signal traces 2, with three ground traces 4 and two signal traces 2. The next routing layer 18 includes alternating signal traces 2 and ground traces 4, with three signal traces 2 and two ground traces 4. The signal traces 2 in routing layer 18 are positioned below the ground traces 4 in routing layer 16, and the ground traces 4 in routing layer 18 are below the signal traces 2 in routing layer 16. Routing layer 20 has the same trace configuration as routing layer 16, and routing layer 22 has the same trace configuration as routing layer 18. The illustrated structure forms a three dimensional array of spaced apart traces, including alternating signal traces 2 and ground traces 4, with the signal traces 2 and ground traces 4 alternating in a horizontal direction and in a vertical direction.

In certain embodiments, the ground traces 4 are formed to be wider than the signal traces 2 (in the horizontal direction as illustrated in FIG. 1). In certain embodiments, wider ground traces are believed to provide better signal integrity performance when compared with ground traces and signal traces having the same width.

The configuration illustrated in FIG. 1 acts to substantially surround the signal traces 2 with ground traces 4. As seen, for example, in routing layer 18, the middle signal trace 2 is positioned between ground traces 4 on either horizontal side (within routing layer 18) and also between ground traces 4 on either vertical side (above in routing layer 16 and below in routing layer 20). Other signal traces 2 are similarly surrounded by ground traces 4, except those signal traces that are in the uppermost routing layer 16 or the lowermost routing layer 22, or at the end of one of the other routing layers 18, 20. The alternating layout results in the signal traces 2 being somewhat surrounded by the ground traces 4 on multiple sides of the signal traces 2. Such a structure acts to shield the traces in a manner somewhat similar to a coaxial cable with an inner conductor surrounded by a shielding conductor.

Any suitable dielectric material may be positioned between the signal traces 2 and the ground traces 4. As illustrated in FIG. 1, the dielectric material includes dielectric material 6 throughout most of the substrate 10 and dielectric layer 6' in the uppermost layer. In certain embodiments, the dielectric material 6' between the signal traces 2 and the ground traces 4 in the uppermost routing layer 16 may be a material such as a photoresist material that is used as a photoresist mask, with openings at pad regions in a bump-out region (not shown in FIG. 1) of the substrate 10. The other routing layers 18, 20, and 22 as illustrated in the embodiment of FIG. 1 include dielectric material 6 positioned between the traces 2, 4, and between the routing layers 16, 18, 20, and 22. Any suitable dielectric material may be used, including, for example, ceramic, glass, and polymeric materials. One specific example of a suitable polymeric dielectric material is ABF (Ajinomoto Build-up Film), available from Ajinomoto Fine-Techno Company, Inc. The dielectric structure may be varied from that illustrated in FIG. 1, for example, certain embodiments may have an uppermost dielectric layer that is flush with an upper surface of the upper wiring layer, or may have open regions between the traces and bonding pads in the uppermost wiring layer. Still other embodiments may, for example, use the same dielectric material in all of the routing layers. The layers of dielectric and traces may be formed using any suitable process, including, but not limited to, a bumpless build-up layer (BBUL) process.

While four routing layers 16, 18, 20, and 22 are illustrated in FIG. 1, embodiments may include more or less rows of alternating signal and ground traces. Any suitable number of traces per layer may also be used, with different layers having a different number of traces if desired. Embodiments may also include additional layers above and/or below the routing layers 16, 18, 20, and 22. For example, the substrate 10 in FIG. 1 includes layer 8 positioned below the routing layer 22. The layer 8 which may be formed from one or more sub-layers including, but not limited to, one or more additional routing layers (including metal and dielectric), protective layers, core layers, metallization layers, and other device layers (for example, capacitor layers). The routing structure may be formed as a discrete component or as a portion of another component. The routing structure may be formed as part of an active component or as part or all of a passive component.

Figure 2:
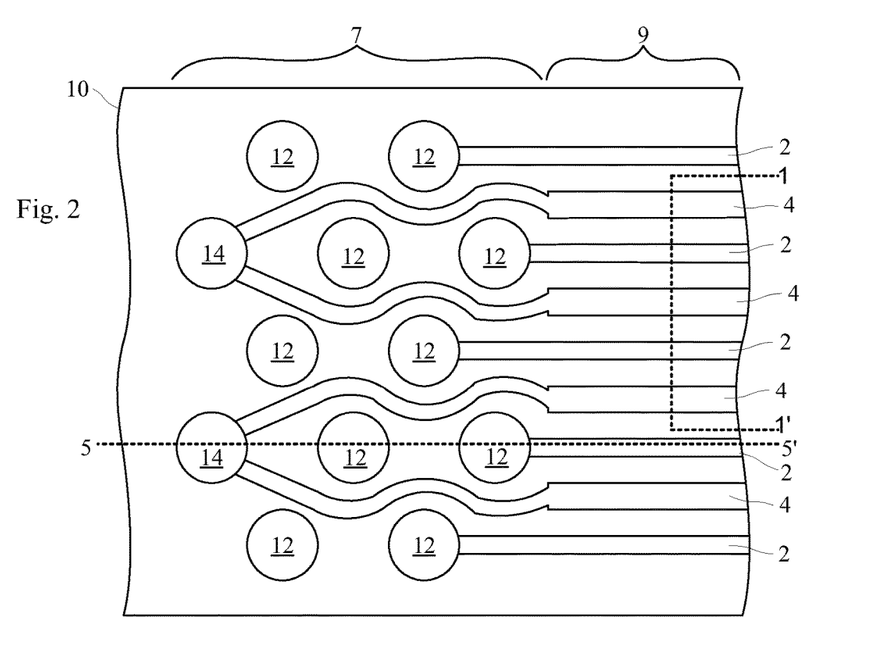
FIG. 2 illustrates a top down view of a routing layout including pads and traces, in accordance with certain embodiments.

FIG. 2 illustrates a top down view of an uppermost pad and routing trace pattern on a portion of a multilayer substrate 10, in accordance with certain embodiments. Traces 2, 4 coupled to the pads 12, 14 in a bump-out region 7 of the substrate extend through a main routing region 9, as illustrated in FIG. 2. The traces 2, 4 in the main routing region 9 in the embodiment of FIG. 2 are parallel or substantially parallel to one another. Other trace geometries are also possible. The dotted line 1-1' in FIG. 2 shows the portion of the substrate 10 that the cross-sectional view in FIG. 1 corresponds to, in a portion of the main routing region 9 of the substrate 10 where a plurality of the traces extend in a parallel or substantially parallel manner to one another in routing layer 16. To show the pad and routing pattern more clearly, the uppermost dielectric layer 6' from FIG. 1 is not illustrated in FIG. 2.

The pads and traces in FIG. 2 include signal pads 12 and ground pads 14, with the signal traces 2 extending from signal pads 12 and the ground traces 4 extending from ground pads 14. Electrical connections to a die may be made through the signal pads 12 and the ground pads 14 using any suitable connection, for example, solder bumps. As illustrated in FIG. 2, not all of the signal pads 12 include a signal trace 2 extending therefrom. Certain of the signal pads 12 are positioned directly over electrically conductive vias (not shown in FIG. 2) that are electrically coupled to signal traces in a lower level of the substrate 10.

As illustrated in FIG. 2, the ground pads 14 may include multiple traces extending therefrom, in order to provide for alternating ground traces 4 and signal traces 2 as illustrated on the right hand side of FIG. 2 (corresponding to routing layer 16 in FIG. 1), while at the same time using a relatively small number of ground pads 14 on the surface of the substrate 10. The ground pads 14 may be positioned over electrically conductive vias (not shown in FIG. 2) so that ground traces may be formed in lower levels of the substrate 10.

Figure 3:
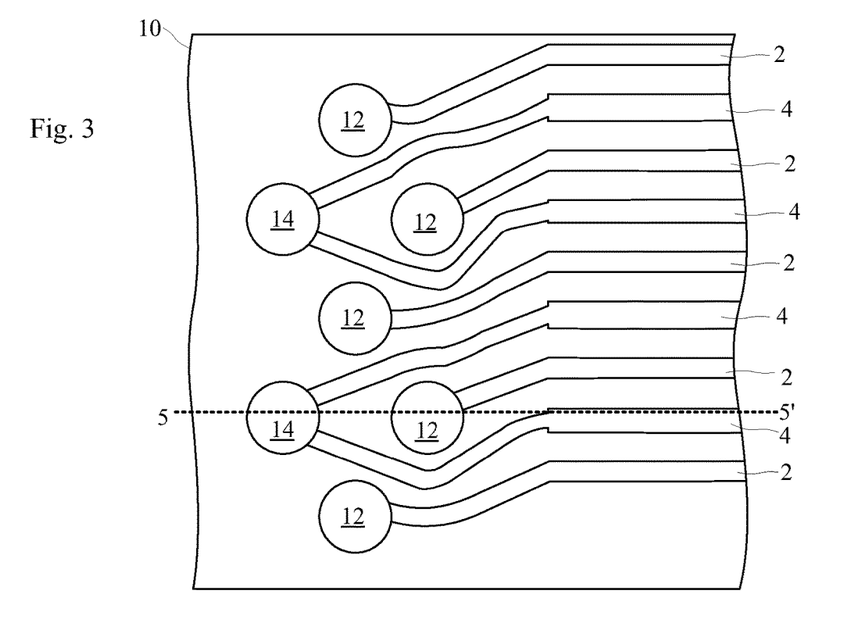
FIG. 3 illustrates a top down view of a routing layout in a layer below the layer in FIG. 2, in accordance with certain embodiments.

FIG. 3 illustrates a lower level of a portion of the substrate 10, including signal pads 12 and ground pads 14 that were electrically coupled to certain signal pads 12 and the ground pads 14 of the uppermost pad and routing layer 16 illustrated in FIG. 2 through electrically conductive vias. Signal traces 2 extend from the signal pads 12 and ground traces 4 extend from the ground pads 14. The illustrated trace routing pattern of FIG. 3 corresponds to a portion of the routing layer 18 in FIG. 1, with alternating signal traces 2 and ground traces 4 positioned on the right hand side of FIG. 3. Such a routing structure, also utilizing multiple trace connections to a single ground pad 14, and electrically conductive vias, enables shielding around signal traces without having to increase number of uppermost ground pads 14 or ground bumps positioned thereon. As seen in the embodiment illustrated in FIGS. 2-3, adjacent signal traces 2 are separated by a ground traces 4.

Figure 4:
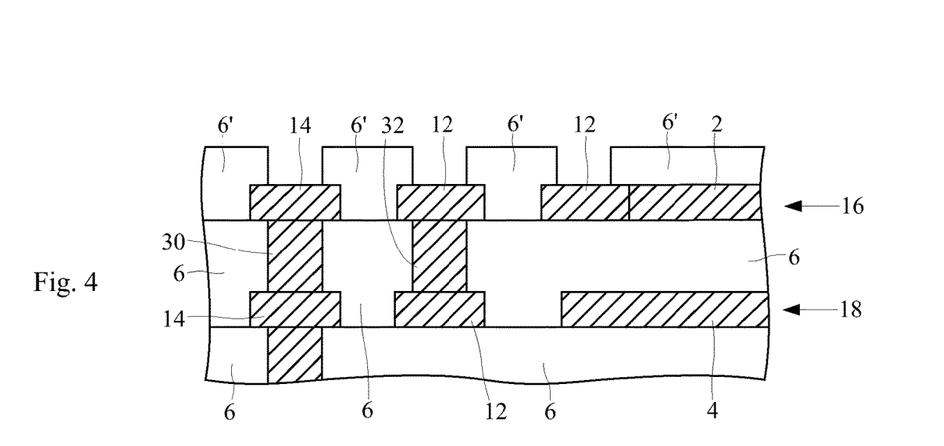
FIG. 4 illustrates a cross-sectional view of a routing layout in two layers of a multilayer substrate, in accordance with certain embodiments.

FIG. 4 illustrates a cross-sectional view along the dotted line 5-5' in FIGS. 2-3. The layout along the uppermost routing layer 16 corresponds to the cross-sectional view along line 5-5' in FIG. 2, and the layout along the lower routing layer 18 corresponds to the cross-sectional along line 5-5' in FIG. 3. Lower level routing layers, including routing layers 20 and 22 from FIG. 1, are not illustrated in FIG. 4.

As illustrated in FIGS. 2 and 4, the view along line 5-5' includes a ground pad 14 and two signal pads 12, with one of the signal pads 12 having a signal trace 2 electrically coupled thereto within the upper routing layer 16. An electrically conductive via 30 is formed below the ground pad 14 so that lower level ground traces can utilize the same upper ground pad 14 connection to a component positioned thereon. Similarly, an electrically conductive via 32 is formed below the central signal pad 12 so that a lower level signal trace can utilize the upper signal pad 12 connection. As illustrated in FIGS. 3 and 4, the view along line 5-5' includes a ground pad 14, a signal pad 12, and a ground trace 4 that, as seen in FIG. 3, is electrically coupled to the ground pad 14 within the routing layer 18. The uppermost dielectric layer 6' is formed to define mask openings over the uppermost ground pad 14 and signal pads 12.

Figure 5:
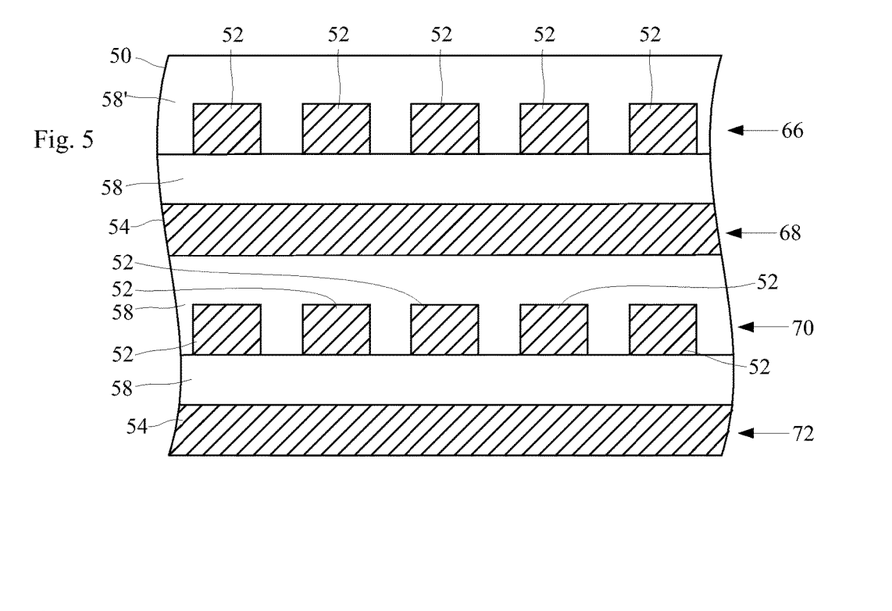
FIG. 5 illustrates a cross-sectional view of a routing layout including layers of signal traces and ground planes.

As illustrated in FIG. 1, certain embodiments may utilize multiple routing layers that each include both signal traces and ground traces. In a microstrip and/or stripline routing structure, there may be alternating layers of signal traces and ground or reference planes, as illustrated, for example, in the cross-sectional view of FIG. 5. The microstrip/stripline structure in FIG. 5 includes a substrate 50 including a region with alternating layers of either a plurality of signal traces 52 or a ground plane layer 54. The structure of FIG. 1, on the other hand, instead of dedicating entire layers to either signal traces or a ground plane, places both signal traces 2 and ground traces 4 on the same layer. This enables the same number of signal traces to be utilized in the multilayer structure. For example, FIG. 1 illustrates four routing layers 16, 18, 20, 22 including two or three signal traces 2 per layer, for a total of ten signal traces 2, and FIG. 5 illustrates four layers 66, 68, 70, 72 including two signal trace layers 66, 70 with five signal traces 52 in each layer, and two ground plane layers 54. Both structures include ten total signal traces. With the same total number of signal traces in the same area of the substrate, the same bump pattern may be used for the microstrip/stripline configuration of FIG. 5 and for the configuration of FIG. 1.

Test results indicated that a structure such as in FIG. 1, with rows of alternating signal traces and ground traces, showed improved signal integrity performance by significantly reducing the crosstalk level, when compared with a microstrip/stripline structure such as in FIG. 5. Thus, when using the same pad structure in the same area on a substrate, improved performance may be obtained using the alternating signal and ground trace configurations as described herein and illustrated, for example, in FIG. 1.

Figure 6:
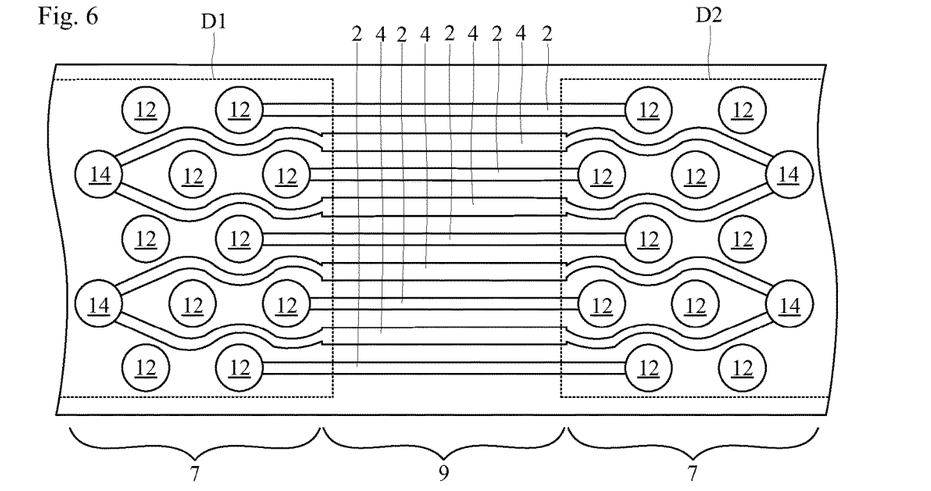
FIG. 6 illustrates a top down view of a surface routing layout for an assembly including multiple components, in accordance with certain embodiments.

Certain embodiments include multiple components that have some electrical connections to one another through a substrate. The components may in certain embodiments comprise individual die structures or a packaged device. FIG. 6 illustrates an embodiment including a substrate including regions D1 and D2 on which components may be electrically coupled. The components to be coupled to the regions D1 and D2 may include, but are not limited to, die structures. The components may be solder bonded to bonding pads including signal pads 12 and ground pads 14 in the positions D1 and D2. The signal pads 12 are electrically coupled to signal traces 2 and the ground pads 14 are electrically coupled to ground traces 4. Substrate bump-out regions 7 are located on the substrate within the regions D1, D2, with a main routing region 9 of traces 2, 4 positioned between the bump-out regions 7. At least some of the signal pads 12 and ground pads 14 are electrically coupled to pads at lower level routing layers (not shown in FIG. 6) such as discussed above in connection with FIGS. 1-4.

Figure 7:
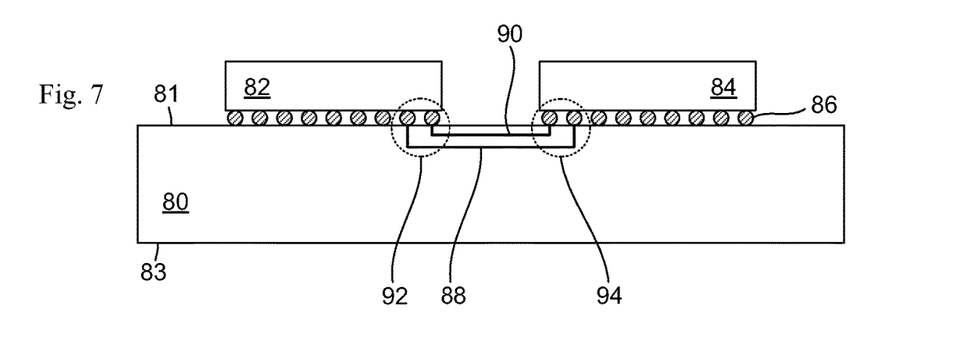
FIG. 7 illustrates a side view of an electrical path in a substrate, in accordance with certain embodiments.

As illustrated in FIG. 6, certain embodiments include multiple components that have some electrical connections to one another through a substrate. FIG. 7 is a side view illustrating an embodiment including assembly including a plurality of components 82, 84 positioned on a surface 81 of a substrate 80 through a suitable connection such as solder bumps 86. The components 82, 84 may be structures including, but not limited to, individual die structures and packaged die structures. The substrate may comprise a variety of structures, including, but not limited to, a bridge, an interposer, a package substrate, and a printed circuit board. Electrical pathways 88, 90 extend through the substrate 80 between the components 82, 84. Substrate bump-out regions are indicated by the dotted line circles 92, 94. The electrical pathways 88, 90 that connect to the components 82, 84 through the solder bumps 86 may define a routing structure similar to the embodiments described above, including a main routing region of alternating signal traces and ground traces between the bump out regions 92, 94. Other connections from the substrate components 82, 84 to the substrate 80 at regions spaced away from the bump-out regions 92, 94 may be made, for example, for power connections to a power supply. The substrate 80 may optionally include a variety of other layers such as, for example, core layers, additional routing layers, and protective layers. The surface 83 of the substrate 80 may in certain embodiments be coupled to a structure such as a printed circuit board (PCB).

Figure 8:
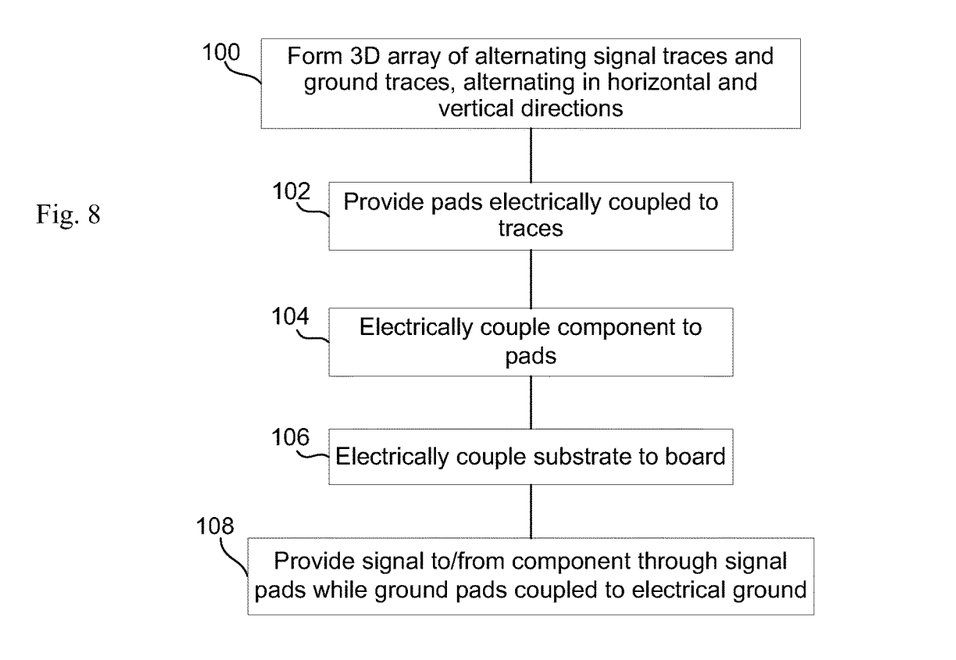
FIG. 8 illustrates a flow chart of operations for processing an assembly including a component coupled to a substrate, in accordance with certain embodiments.

FIG. 8 is a flowchart of operations for processing an assembly, in accordance with certain embodiments. Box 100 is forming a three dimensional (3D) array including alternating signal traces and ground traces, with the signal traces and ground traces alternating in both a horizontal direction and in a vertical direction. The signal traces and ground traces may be separated by dielectric material. The traces and dielectric material positioned therebetween may be formed using any suitable processing operations, including, but not limited to, a BBUL process. Box 102 is providing pads electrically coupled to the signal traces and the ground traces. Box 104 is electrically coupling a component such as an die to the pads on the substrate. Box 106 is electrically coupling substrate having the component positioned thereon to another component such as a PCB, using any suitable connection mechanism, for example, solder bumps. Box 108 is providing a signal through at least some of the signal pads while the ground pads are coupled to an electrical ground.

Embodiments in accordance with the process flow of FIG. 8 may be applicable to a wide variety of assembly configurations. One such configuration includes a component such as a die coupled to a substrate, with the substrate coupled to a structure such as, for example, a PCB. In such a case the substrate may include a bump-out region on one surface of the substrate, and another bump-out region on an opposite surface of the substrate. Signals may travel from the PCB to the component through the entire thickness of the substrate. Another such configuration includes, for example, multiple components coupled to the same surface of a substrate. The substrate may also be coupled to a board such as a PCB.

Figure 9:
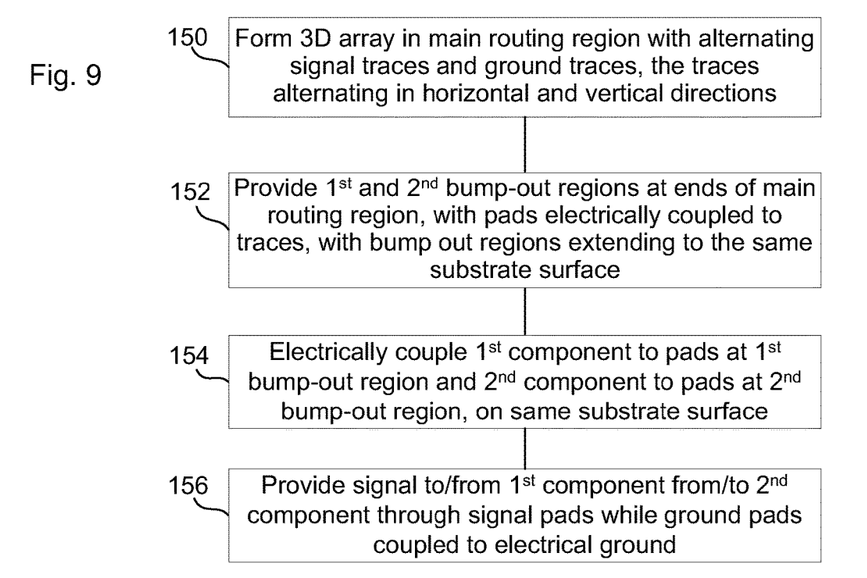
FIG. 9 illustrates a flow chart of operations for processing an assembly including a plurality of components coupled to a substrate, in accordance with certain embodiments.

FIG. 9 is a flowchart of operations for processing an assembly including multiple components coupled to the same surface of a substrate, in accordance with certain embodiments. Box 150 is forming, in a main routing region of a substrate, a three dimensional (3D) array including alternating signal traces and ground traces, with the signal traces and ground traces alternating in both a horizontal direction and in a vertical direction. The signal traces and ground traces may be separated by dielectric material. The traces and dielectric material positioned therebetween may be formed using any suitable processing operations, including, but not limited to, a BBUL process. Box 152 is providing first and second bump-out regions at ends of the main routing region, with pads electrically coupled to the signal traces and the ground traces, and with the bump-out regions extending to the same surface of the substrate. Box 154 is electrically coupling the first component to pads at the first bump-out region and electrically coupling the second component to pads at the second bump-out region, on the same surface of the substrate. Box 156 is providing a signal to or from the first component from or to the second component through at least some of the signal pads while the ground pads are coupled to an electrical ground.

It should be appreciated that many changes may be made within the scope of the embodiments described herein. For example, while the embodiment in FIG. 1 illustrates four routing layers, more or less layers may be utilized. In addition, while FIG. 6 illustrates locations for two die structures to be positioned on a substrate, embodiments may include any number of die structures or other components on a substrate. Such substrates may in certain embodiments comprise package substrates to be positioned on another structure, for example, a PCB. Embodiments of routing structures such as described above may be formed on a variety of substrate structures, including, but not limited to, interposers, bridges, PCBs, and die structures. A die is usually singulated from a wafer, and wafers may be made of semiconducting, non-semiconducting, or combinations of semiconducting and non-semiconducting materials.

Figure 10:
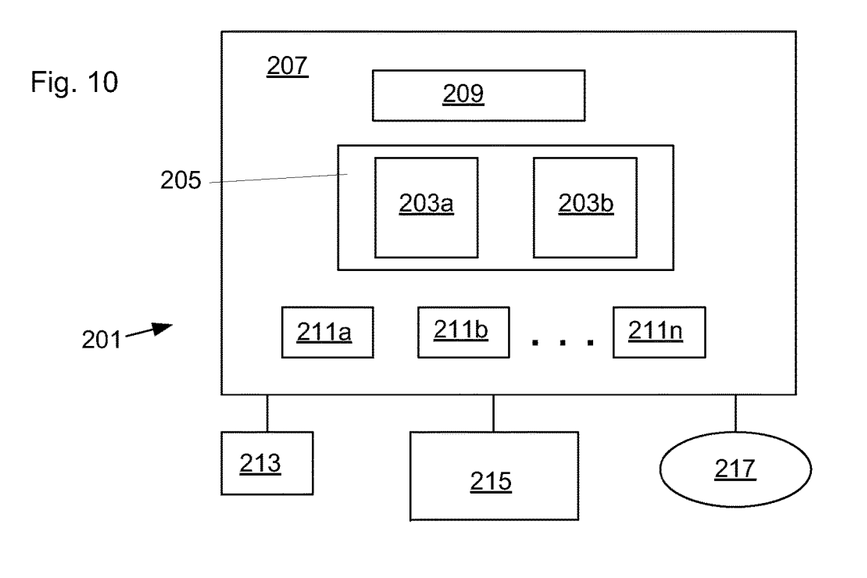
FIG. 10 illustrates an electronic system arrangement in which embodiments may find application.

Assemblies including structures formed as described in embodiments above may find application in a variety of electronic systems. FIG. 10 schematically illustrates one example of an electronic system environment in which aspects of described embodiments may be embodied. Other embodiments need not include all of the features specified in FIG. 10, and may include alternative features not specified in FIG. 10.

The system 201 of FIG. 10 may include at least two central processing units (CPUs) 203a, 203b. The CPUs 203a, 203b, also referred to as microprocessors, may be die structures attached to a package substrate 205, which is then coupled to a printed circuit board 207 (for example, a motherboard). The CPUs 203a, 203b coupled to the package substrate 205 are one example of an assembly that may be formed in accordance with embodiments such as described above, including layers of alternating signal traces and ground traces in the package substrate 205. A variety of other system components, in addition to, or in place of, one or both of the CPUs 203a, 203b, may also be positioned on the package substrate 205. Such components may include, but are not limited to, additional CPU structures, memory, switches, and other components as discussed below. By locating various components on the substrate 205, the size of the entire system may be decreased.

The system 201 may further include memory 209 and one or more controllers 211a, 211b . . . 211n, which are also disposed on the motherboard 207. The motherboard 207 may be a single layer or multi-layered board which has a plurality of conductive lines that provide communication between the circuits in the package 205 and other components mounted to the board 207. Alternatively, one or more of the CPUs 203a, 203b, memory 209 and controllers 211a, 211b . . . 211n may be disposed on other cards such as daughter cards or expansion cards. The CPUs 203a, 203b, memory 209 and controllers 211a, 211b . . . 211n may be seated in sockets or may be connected directly to a printed circuit board or all integrated in the same package. A display 215 may also be included.

Any suitable operating system and various applications execute on the CPUs 203a, 203b and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, netbook, tablet, book reader, handheld gaming device, handheld entertainment device (for example, MP3 (moving picture experts group layer—3 audio) player), PDA (personal digital assistant), smartphone or other telephony device (wireless or wired), network appliance, virtualization device, storage controller, network controller, router, etc.

The controllers 211a, 211b . . . 211n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

Terms such as "first", "second", "third", "fourth", and the like as used herein to not necessarily denote any particular order, quantity, or importance, but are used to distinguish one element from another. Terms such as "top", bottom", "upper", "lower", "uppermost", "lowermost", and the like, as used herein, are for descriptive purposes and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A routing structure comprising:
a multilayer substrate including a first region comprising a three dimensional array of spaced apart traces, the spaced apart traces including alternating signal traces and ground traces, wherein the signal traces and ground traces are alternating in a horizontal direction and in a vertical direction, wherein the first region includes an upper layer including a first ground trace, a second ground trace, and a signal trace between the first ground trace and the second ground trace;
the multilayer substrate further including a second region including an upper layer including a plurality of pads comprising a plurality of signal pads and a plurality of ground pads, including a first ground pad; wherein the first ground trace and the second ground trace each extend from the first region to the first ground pad in the second region, and wherein the first ground trace and the second ground trace are each in direct contact with the first ground pad in the second region; and the multilayer substrate further comprising a third region, the first region positioned between the second region and the third region, the third region including an additional plurality of pads, and wherein the signal traces and ground traces from the first region extend into the third region and are coupled to at least some of the additional plurality of pads in the third region.

2. The routing structure of claim 1, wherein, in the first region, the ground traces have a width that is greater than that of the signal traces.

3. The routing structure of claim 1, wherein the three dimensional array of spaced apart traces includes four rows of spaced apart traces.

4. The routing structure of claim 1, further comprising a die electrically coupled to the multilayer substrate in the second region.

5. The routing structure of claim 1, further comprising a first die electrically coupled to the multilayer substrate in the second region and a second die electrically coupled to the multilayer substrate in the third region.

6. The routing structure of claim 5, wherein the multilayer substrate includes a first surface and a second surface opposite the first surface, and wherein the first die and the second die are positioned on the first surface.

7. The routing structure of claim 1, wherein the upper layer includes a plurality of signal pads having no signal trace extending thereto.

8. The routing structure of claim 1, wherein the first ground trace and the second ground trace each have a width that is greater in the first region than in the second region.

9. A routing structure comprising:
a first region including:
a first layer comprising alternating signal traces and ground traces separated by a dielectric material; and
a second layer comprising alternating signal traces and ground traces separated by a dielectric material;
wherein the signal traces in the first layer are positioned over the ground traces in the second layer, and wherein the ground traces in the first layer are positioned over the signal traces in the second layer; and
a second region including a plurality of signal pads and a plurality of ground pads, including a first ground pad and a first signal pad;
wherein the first layer comprising alternating signal traces and ground traces includes a first ground trace, a second ground trace, and a signal trace between the first ground trace and the second ground trace, wherein the first ground trace and the second ground trace from the first layer of the first region each extend to and physically contact the first ground pad in the second region;
a third region including a plurality of additional ground pads and a plurality of additional signal pads, wherein the first region is positioned between the second region and the third region;
a die structure coupled to the second region of the routing structure; and
an additional die structure coupled to the third region of the routing structure.

10. The routing structure of claim 9, wherein the ground traces include a width that is greater than that of the signal traces.

11. The routing structure of claim 9, wherein adjacent ground traces and signal traces in the first region are parallel to each other along at least part of their length.

12. The routing structure of claim 9, further comprising, in the first region:
a third layer comprising alternating signal traces and ground traces separated by a dielectric material, wherein the signal traces in the second layer are positioned over the ground traces in the third layer, and wherein the ground traces in the second layer are positioned over the signal traces in the third layer; and
a fourth layer comprising alternating signal traces and ground traces separated by a dielectric material, wherein the signal traces in the third layer are positioned over the ground traces in the fourth layer, and wherein the ground traces in the third layer are positioned over the signal traces in the fourth layer.

13. The routing structure of claim 12, further comprising a dielectric material positioned between the first layer and the second layer, between the second layer and the third layer, and between the third layer and the fourth layer.

14. The routing structure of claim 9, wherein none of the signal traces from the first layer of the first region extend to the first signal pad in the second region.

15. The routing structure of claim 9, wherein the first ground trace and the second ground trace each have a width that is greater in the first region than in the second region.

16. A routing structure, comprising:
a first region;
a second region; and
a main routing region positioned between the first region and the second region and extending from the first region to the second region, the main routing region comprising:
a first routing layer of traces comprising a plurality of signal traces extending from the first region to the second region and a plurality of ground traces extending from the first region to the second region, the signal traces and the ground traces configured to alternate between a signal trace and a ground trace across the first routing layer;
a second routing layer of traces comprising a plurality of ground traces extending from the first region to the second region and a plurality of signal traces extending from the first region to the second region, the ground traces and the signal traces positioned to alternate between a ground trace and a signal trace across the second routing layer; and
a dielectric material positioned between the signal traces and the ground traces in the first routing layer of traces, and between the signal traces and the ground traces in the second routing layer of traces, the dielectric material also positioned to extend between the first routing layer of traces and the second routing layer of traces;
wherein the signal traces in the first routing layer of traces are positioned over the ground traces in the second routing layer of traces, and wherein the ground traces in the first routing layer of traces are positioned over the signal traces in the second routing layer of traces;
wherein the first region comprises a plurality of ground pads and a plurality of signal pads, including a first ground pad and a first signal pad;
wherein the plurality of ground traces in the first routing layer of traces include a first ground trace and a second ground trace; and
wherein the first ground trace and the second ground trace each extend from the main routing region to the first ground pad in the first region, and wherein the first ground trace and the second ground trace are each in direct contact with the first ground pad in the first region.

17. The routing structure of claim 16, wherein the first region comprising a plurality of ground pads and a plurality of signal pads comprises a first bump-out region, and wherein the second region comprises a second bump-out region comprising an additional plurality of ground pads and an additional plurality of signal pads.

18. The routing structure of claim 16, wherein the signal traces and the ground traces in the first routing layer of traces in the main routing region are parallel to one another.

19. The routing structure of claim 16, wherein, in the main routing region, the ground traces in the first routing layer of traces have a width that is greater than that of the signal traces in the first routing layer of traces, and wherein the ground traces in the second routing layer of traces have a width that is greater than that of the signal traces in the second routing layer of traces.

20. The routing structure of claim 16, wherein none of the plurality of signal traces in the first routing layer of the main routing region extend to the first signal pad in the first region.

21. The routing structure of claim 16, wherein the first ground trace and the second ground trace each have a width that is greater in the main routing region than in the first region.

\* \* \* \* \*